US012374556B2

(12) United States Patent
Uzoh et al.

(10) Patent No.: US 12,374,556 B2
(45) Date of Patent: Jul. 29, 2025

(54) PROCESSING STACKED SUBSTRATES

(71) Applicant: ADEIA SEMICONDUCTOR BONDING TECHNOLOGIES INC., San Jose, CA (US)

(72) Inventors: Cyprian Emeka Uzoh, San Jose, CA (US); Guilian Gao, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 17/825,224

(22) Filed: May 26, 2022

(65) Prior Publication Data

US 2023/0008039 A1 Jan. 12, 2023

Related U.S. Application Data

(63) Continuation of application No. 16/921,110, filed on Jul. 6, 2020, now Pat. No. 11,348,801, which is a
(Continued)

(51) Int. Cl.
*H01L 21/311* (2006.01)
*H01L 21/02* (2006.01)
(Continued)

(52) U.S. Cl.
CPC .. *H01L 21/31111* (2013.01); *H01L 21/02057* (2013.01); *H01L 21/31133* (2013.01);
(Continued)

(58) Field of Classification Search
CPC ........... H01L 21/02057; H01L 21/6835; H01L 21/6836; H01L 2221/68327;
(Continued)

(56) References Cited

U.S. PATENT DOCUMENTS 5,034,343 A 7/1991 Rouse et al.
5,753,536 A 5/1998 Sugiyama et al.
(Continued)

FOREIGN PATENT DOCUMENTS

CN 107611075 A 1/2018
JP 2002-353416 A 12/2002
(Continued)

OTHER PUBLICATIONS

International Search Report and Written Opinion for PCT/US2017/067304, dated Dec. 19, 2017, 13 pages.
(Continued)

*Primary Examiner* — Britt D Hanley
*Assistant Examiner* — Victor V Barzykin
(74) *Attorney, Agent, or Firm* — Knobbe, Martens, Olson & Bear, LLP

(57) ABSTRACT

Representative implementations provide techniques for processing integrated circuit (IC) dies and related devices, in preparation for stacking and bonding the devices. The disclosed techniques provide removal of processing residue from the device surfaces while protecting the underlying layers. One or more sacrificial layers may be applied to a surface of the device during processing to protect the underlying layers. Processing residue is attached to the sacrificial layers instead of the device, and can be removed with the sacrificial layers.

21 Claims, 5 Drawing Sheets

Related U.S. Application Data continuation of application No. 15/846,731, filed on Dec. 19, 2017, now Pat. No. 10,707,087.

(60) Provisional application No. 62/439,771, filed on Dec. 28, 2016.

(51) Int. Cl.
*H01L 21/683* (2006.01)
*H01L 21/768* (2006.01)
*H01L 21/78* (2006.01)

(52) U.S. Cl.
CPC ...... *H01L 21/6835* (2013.01); *H01L 21/6836* (2013.01); *H01L 21/78* (2013.01); *H01L 21/76813* (2013.01); *H01L 21/76816* (2013.01); *H01L 21/76832* (2013.01); *H01L 21/76865* (2013.01); *H01L 2221/68327* (2013.01); *H01L 2221/6834* (2013.01); *H01L 2221/68381* (2013.01)

(58) Field of Classification Search
CPC ... H01L 2221/6834; H01L 2221/68381; H01L 21/31111; H01L 21/31133; H01L 21/78; H01L 21/76813; H01L 21/76816; H01L 21/76832; H01L 21/76865
See application file for complete search history.

(56) References Cited

U.S. PATENT DOCUMENTS

| | | | |
|---|---|---|---|
| 5,771,555 A | 6/1998 | Eda et al. | |
| 5,897,743 A | 4/1999 | Fujimoto et al. | |
| 5,985,742 A | 11/1999 | Henley et al. | |
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| RE39,484 E | 2/2007 | Bruel | |
| 7,193,423 B1 | 3/2007 | Dalton et al. | |
| 7,226,812 B2 | 6/2007 | Lu et al. | |
| 7,713,840 B2 | 5/2010 | Kelly et al. | |
| 7,750,488 B2 | 7/2010 | Patti et al. | |
| 7,759,050 B2 | 7/2010 | Kessel et al. | |
| 7,795,113 B2 | 9/2010 | Swinnen et al. | |
| 7,803,693 B2 | 9/2010 | Trezza | |
| 7,910,458 B2 | 3/2011 | Henley | |
| 7,932,614 B2 | 4/2011 | Codding et al. | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,461,017 B2 | 6/2013 | Sadaka et al. | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,505,197 B2 | 8/2013 | Blanchard | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,450,115 B2 | 9/2016 | Christensen et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,929,050 B2 | 3/2018 | Lin | |
| 9,929,054 B2 | 3/2018 | Yonehara et al. | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,086,584 B2 | 10/2018 | Bellman et al. | |
| 10,157,766 B2 | 12/2018 | Kang et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,707,087 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,573 B2 | 10/2021 | Uzoh et al. | |
| 11,158,606 B2 | 10/2021 | Gao et al. | |
| 11,169,326 B2 | 11/2021 | Huang et al. | |
| 11,171,117 B2 | 11/2021 | Gao et al. | |
| 11,176,450 B2 | 11/2021 | Teig et al. | |
| 11,195,748 B2 | 12/2021 | Uzoh et al. | |
| 11,205,625 B2 | 12/2021 | DeLaCruz et al. | |
| 11,244,920 B2 | 2/2022 | Uzoh | |
| 11,256,004 B2 | 2/2022 | Haba et al. | |
| 11,264,357 B1 | 3/2022 | DeLaCruz et al. | |

(56) References Cited

U.S. PATENT DOCUMENTS

| | | | |
|---|---|---|---|
| 11,274,234 B2 | 3/2022 | Zhang et al. | |
| 11,276,676 B2 | 3/2022 | Enquist et al. | |
| 11,296,044 B2 | 4/2022 | Gao et al. | |
| 11,329,034 B2 | 5/2022 | Tao et al. | |
| 11,348,801 B2 * | 5/2022 | Uzoh | H01L 21/02057 |
| 11,348,898 B2 | 5/2022 | DeLaCruz et al. | |
| 11,355,443 B2 | 6/2022 | Huang et al. | |
| 11,791,307 B2 | 10/2023 | Mandalapu et al. | |
| 2002/0003307 A1 | 1/2002 | Suga | |
| 2002/0048906 A1 | 4/2002 | Sakai et al. | |
| 2002/0056927 A1 | 5/2002 | Ohuchi et al. | |
| 2004/0084414 A1 | 5/2004 | Sakai et al. | |
| 2004/0241958 A1 | 12/2004 | Guarini et al. | |
| 2005/0029224 A1 | 2/2005 | Aspar et al. | |
| 2006/0057945 A1 | 3/2006 | Hsu et al. | |
| 2006/0264004 A1 | 11/2006 | Tong et al. | |
| 2007/0111386 A1 | 5/2007 | Kim et al. | |
| 2008/0166525 A1 * | 7/2008 | Swinnen | H01L 21/6835 216/41 |
| 2008/0280416 A1 | 11/2008 | Bedell et al. | |
| 2009/0152655 A1 | 6/2009 | Laming et al. | |
| 2010/0263794 A1 | 10/2010 | George et al. | |
| 2011/0092051 A1 | 4/2011 | Moriceau et al. | |
| 2013/0137244 A1 | 5/2013 | Kramer et al. | |
| 2014/0011324 A1 * | 1/2014 | Liu | H01L 24/74 438/455 |
| 2014/0091458 A1 | 4/2014 | Van Gemert et al. | |
| 2014/0094079 A1 | 4/2014 | Ito et al. | |
| 2014/0175655 A1 | 6/2014 | Chen et al. | |
| 2014/0183728 A1 | 7/2014 | Han et al. | |
| 2014/0213039 A1 | 7/2014 | Lee et al. | |
| 2014/0273334 A1 | 9/2014 | Christensen et al. | |
| 2015/0064498 A1 | 3/2015 | Tong | |
| 2015/0228535 A1 | 8/2015 | Sadaka et al. | |
| 2016/0093518 A1 | 3/2016 | Jung et al. | |
| 2016/0141260 A1 | 5/2016 | Chang et al. | |
| 2016/0163590 A1 | 6/2016 | Jung et al. | |
| 2016/0181228 A1 | 6/2016 | Higuchi et al. | |
| 2016/0233111 A1 | 8/2016 | Shiota et al. | |
| 2016/0326409 A1 | 11/2016 | Tokuyasu et al. | |
| 2016/0343682 A1 | 11/2016 | Kawasaki | |
| 2016/0343685 A1 | 11/2016 | Lin et al. | |
| 2016/0358898 A1 | 12/2016 | Zhou et al. | |
| 2017/0004990 A1 | 1/2017 | Kang et al. | |
| 2017/0018450 A1 | 1/2017 | Tang | |
| 2017/0069535 A1 | 3/2017 | Masuko | |
| 2017/0092620 A1 | 3/2017 | Haba et al. | |
| 2017/0179029 A1 | 6/2017 | Enquist et al. | |
| 2017/0200756 A1 | 7/2017 | Kao et al. | |
| 2018/0012751 A1 | 1/2018 | Kamochi et al. | |
| 2018/0138072 A1 | 5/2018 | Andry et al. | |
| 2018/0158713 A1 | 6/2018 | Okita et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0204868 A1 | 7/2018 | Kao et al. | |
| 2018/0219038 A1 | 8/2018 | Gambino et al. | |
| 2018/0294241 A1 | 10/2018 | Chen et al. | |
| 2018/0297324 A1 | 10/2018 | Adib et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2018/0351030 A1 | 12/2018 | Goward | |
| 2019/0115277 A1 | 4/2019 | Yu et al. | |
| 2019/0131277 A1 | 5/2019 | Yang et al. | |
| 2019/0198377 A1 | 6/2019 | Hacker | |
| 2019/0198409 A1 | 6/2019 | Katkar et al. | |
| 2019/0333550 A1 | 10/2019 | Fisch | |
| 2019/0385935 A1 | 12/2019 | Gao et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. | |
| 2020/0035641 A1 | 1/2020 | Fountain, Jr. et al. | |
| 2020/0075553 A1 | 3/2020 | DeLaCruz et al. | |
| 2020/0108592 A1 | 4/2020 | Tsao et al. | |
| 2020/0118973 A1 | 4/2020 | Wang et al. | |
| 2020/0227367 A1 | 7/2020 | Haba et al. | |
| 2020/0243380 A1 | 7/2020 | Uzoh et al. | |
| 2020/0243481 A1 | 7/2020 | Chung et al. | |
| 2020/0279821 A1 | 9/2020 | Haba et al. | |
| 2020/0294908 A1 | 9/2020 | Haba et al. | |
| 2020/0328162 A1 | 10/2020 | Haba et al. | |
| 2020/0328164 A1 | 10/2020 | DeLaCruz et al. | |
| 2020/0335408 A1 | 10/2020 | Gao et al. | |
| 2020/0371154 A1 | 11/2020 | DeLaCruz et al. | |
| 2020/0395321 A1 | 12/2020 | Katkar et al. | |
| 2020/0411483 A1 | 12/2020 | Uzoh et al. | |
| 2021/0098412 A1 | 4/2021 | Haba et al. | |
| 2021/0118864 A1 | 4/2021 | DeLaCruz et al. | |
| 2021/0143125 A1 | 5/2021 | DeLaCruz et al. | |
| 2021/0181510 A1 | 6/2021 | Katkar et al. | |
| 2021/0193603 A1 | 6/2021 | DeLaCruz et al. | |
| 2021/0193624 A1 | 6/2021 | DeLaCruz et al. | |
| 2021/0193625 A1 | 6/2021 | DeLaCruz et al. | |
| 2021/0233889 A1 | 7/2021 | Mandalapu et al. | |
| 2021/0242152 A1 | 8/2021 | Fountain, Jr. et al. | |
| 2021/0296282 A1 | 9/2021 | Gao et al. | |
| 2021/0305202 A1 | 9/2021 | Uzoh et al. | |
| 2021/0366820 A1 | 11/2021 | Uzoh | |
| 2021/0407941 A1 | 12/2021 | Haba | |
| 2022/0077063 A1 | 3/2022 | Haba | |
| 2022/0077087 A1 | 3/2022 | Haba | |
| 2022/0139867 A1 | 5/2022 | Uzoh | |
| 2022/0139869 A1 | 5/2022 | Gao et al. | |
| 2022/0208650 A1 | 6/2022 | Gao et al. | |
| 2022/0208702 A1 | 6/2022 | Uzoh | |
| 2022/0208723 A1 | 6/2022 | Katkar et al. | |
| 2022/0246497 A1 | 8/2022 | Fountain, Jr. et al. | |
| 2022/0285303 A1 | 9/2022 | Mirkarimi et al. | |
| 2022/0319901 A1 | 10/2022 | Suwito et al. | |
| 2022/0320035 A1 | 10/2022 | Uzoh et al. | |
| 2022/0320036 A1 | 10/2022 | Gao et al. | |
| 2023/0005850 A1 | 1/2023 | Fountain, Jr. | |
| 2023/0019869 A1 | 1/2023 | Mirkarimi et al. | |
| 2023/0036441 A1 | 2/2023 | Haba et al. | |
| 2023/0067677 A1 | 3/2023 | Lee et al. | |
| 2023/0069183 A1 | 3/2023 | Haba | |
| 2023/0100032 A1 | 3/2023 | Haba et al. | |
| 2023/0115122 A1 | 4/2023 | Uzoh et al. | |
| 2023/0122531 A1 | 4/2023 | Uzoh | |
| 2023/0123423 A1 | 4/2023 | Gao et al. | |
| 2023/0125395 A1 | 4/2023 | Gao et al. | |
| 2023/0130259 A1 | 4/2023 | Haba et al. | |
| 2023/0132632 A1 | 5/2023 | Katkar et al. | |
| 2023/0140107 A1 | 5/2023 | Uzoh et al. | |
| 2023/0142680 A1 | 5/2023 | Guevara et al. | |
| 2023/0154816 A1 | 5/2023 | Haba et al. | |
| 2023/0154828 A1 | 5/2023 | Haba et al. | |
| 2023/0187264 A1 | 6/2023 | Uzoh et al. | |
| 2023/0187317 A1 | 6/2023 | Uzoh | |
| 2023/0187412 A1 | 6/2023 | Gao et al. | |
| 2023/0197453 A1 | 6/2023 | Fountain, Jr. et al. | |
| 2023/0197496 A1 | 6/2023 | Theil | |
| 2023/0197559 A1 | 6/2023 | Haba et al. | |
| 2023/0197560 A1 | 6/2023 | Katkar et al. | |
| 2023/0197655 A1 | 6/2023 | Theil et al. | |
| 2023/0207402 A1 | 6/2023 | Fountain, Jr. et al. | |
| 2023/0207437 A1 | 6/2023 | Haba | |
| 2023/0207474 A1 | 6/2023 | Uzoh et al. | |
| 2023/0207514 A1 | 6/2023 | Gao et al. | |
| 2023/0215836 A1 | 7/2023 | Haba et al. | |
| 2023/0245950 A1 | 8/2023 | Haba et al. | |
| 2023/0268300 A1 | 8/2023 | Uzoh et al. | |
| 2023/0299029 A1 | 9/2023 | Theil et al. | |
| 2023/0343734 A1 | 10/2023 | Uzoh et al. | |
| 2023/0360950 A1 | 11/2023 | Gao | |
| 2023/0361074 A1 | 11/2023 | Uzoh et al. | |
| 2023/0369136 A1 | 11/2023 | Uzoh et al. | |
| 2023/0375613 A1 | 11/2023 | Haba et al. | |
| 2024/0038702 A1 | 2/2024 | Uzoh | |
| 2024/0055407 A1 | 2/2024 | Workman | |
| 2024/0079376 A1 | 3/2024 | Suwito et al. | |

(56) References Cited

U.S. PATENT DOCUMENTS

| | | |
|---|---|---|
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0186284 A1 | 6/2024 | Mandalapu et al. |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0282747 A1 | 8/2024 | Mandalapu et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |

FOREIGN PATENT DOCUMENTS

| | | |
|---|---|---|
| JP | 2013-033786 A | 2/2013 |
| JP | 2014-508405 A | 4/2014 |
| JP | 2018-160519 | 10/2018 |
| KR | 10-1128135 | 3/2012 |
| WO | WO 2005/038865 A2 | 4/2005 |
| WO | WO 2005/043584 A2 | 5/2005 |
| WO | WO 2015/113020 A1 | 7/2015 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Monk et al., "Hydrofluoric etching of silicon dioxide sacrificial layers," J. ElectroChem. Soc., 1994, vol. 141, pp. 270-274.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Photo-polymer mass transfer, Terecircuits webpage, www.terecircuits.com/process, downloaded Aug. 23, 2022, 4 pages.

Plobi, A. et al., "Wafer direct bonding: tailoring adhesion between brittle materials," Materials Science and Engineering Review Journal, 1999, R25, 88 pages.

Smart cut, Wikipedia entry, https://en.wikipedia.org/wiki/Smart_cut, 2 sheets.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

"An Overview of Temporary Wafer Bonding Processes," Processing Theories, https://www.brewerscience.com/processing-theories/temporary-bonding/, downloaded Aug. 23, 2022, 11 sheets.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

MICRO Materials, "Wafer AirDebond®—Air-Assisted Mechanical Debonding", downloaded from https://micromaterials-inc.com/ on Jul. 22, 2024; 8 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Navarro E., "Direct Wafer Bonding Dynamics", Mechanics; Doctoral dissertation, Universite Grenoble Alpes; 2014; NNT:2014GRENi023. tel-01048574v2, downloaded from https://theses.hal.science/tel-01048574/document; 116 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

Theil, Jeremy A., "Fluorinated amorphous carbon films for low permittivity interlevel dielectrics," J. Vac. Sci. Technol. B, Nov./Dec. 1999, vol. 17, No. 6, pp. 2397-2410.

Theil, Jeremy A. et al., "The effect of thermal cycling on a-C:F, H low dielectric constant films deposited by ECR plasma enhanced chemical vapor deposition," Appears in the Proceedings of the International Interconnect Technology Conference (IITC), 1998, pp. 128-130.

Theil, Jeremy A. et al., "Thermal stability of a-C:F,H films deposited by electron cyclotron resonance plasma enhanced chemical vapor deposition," Presented at Symposium N of the Spring 1997 MRS Meeting, 1997, 6 pages.

\* cited by examiner

PROCESSING STACKED SUBSTRATES

PRIORITY CLAIM AND CROSS-REFERENCE TO RELATED APPLICATION

This application is a continuation of and claims the benefit of U.S. Non-Provisional application Ser. No. 16/921,110, filed Jul. 6, 2020, which is a continuation of U.S. Non-Provisional application Ser. No. 15/846,731, filed Dec. 19, 2017, which claims the benefit under 35 U.S.C. § 119(e)(1) of U.S. Provisional Application No. 62/439,771, filed Dec. 28, 2016, both of which are hereby incorporated by reference in their entirety.

FIELD

The following description relates to processing of integrated circuits ("ICs"). More particularly, the following description relates to removal of processing residue from the surface of dies, wafers, and other substrates.

BACKGROUND

The demand for more compact physical arrangements of microelectronic elements such as integrated chips and dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips and dies into a small space.

Microelectronic elements often comprise a thin slab of a semiconductor material, such as silicon or gallium arsenide. Chips and dies are commonly provided as individual, pre-packaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein.

However, some stacked arrangements where the surfaces of dies or devices are in intimate contact or proximity to each other are sensitive to the presence of particles or contamination (e.g., greater than 0.5 nm) on one or both surfaces of the stacked dies. For instance, particles remaining from processing steps can result in poorly bonded regions between the stacked dies. Temporary bonding of dies and substrates, for processing or handling, can be particularly problematic, since removal of temporary carriers and substrates can leave behind bonding layer residue.

Residue from temporary bond layers, which can be comprised of high temperature polymers, can be discontinuous with varying thicknesses on the substrate surface (e.g., thickness may range from 50 nm to 30 um). Plasma ashing can be used to remove thin residue, but even long oxygen plasma ashing steps (e.g., over 40 minutes) may not remove the thickest residues, and in many instances, may oxidize the conductive interconnect layer, for example, a copper interconnect layer. In such cases, a high temperature (e.g., over 50° C.) wet process is sometimes used to remove thick residue; however, the process may not be compatible with other die layers or materials. For instance, the high temperature wet process can degrade the smoothness of the polished metal layers, reducing device yield.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include

SUMMARY

Figure 1:
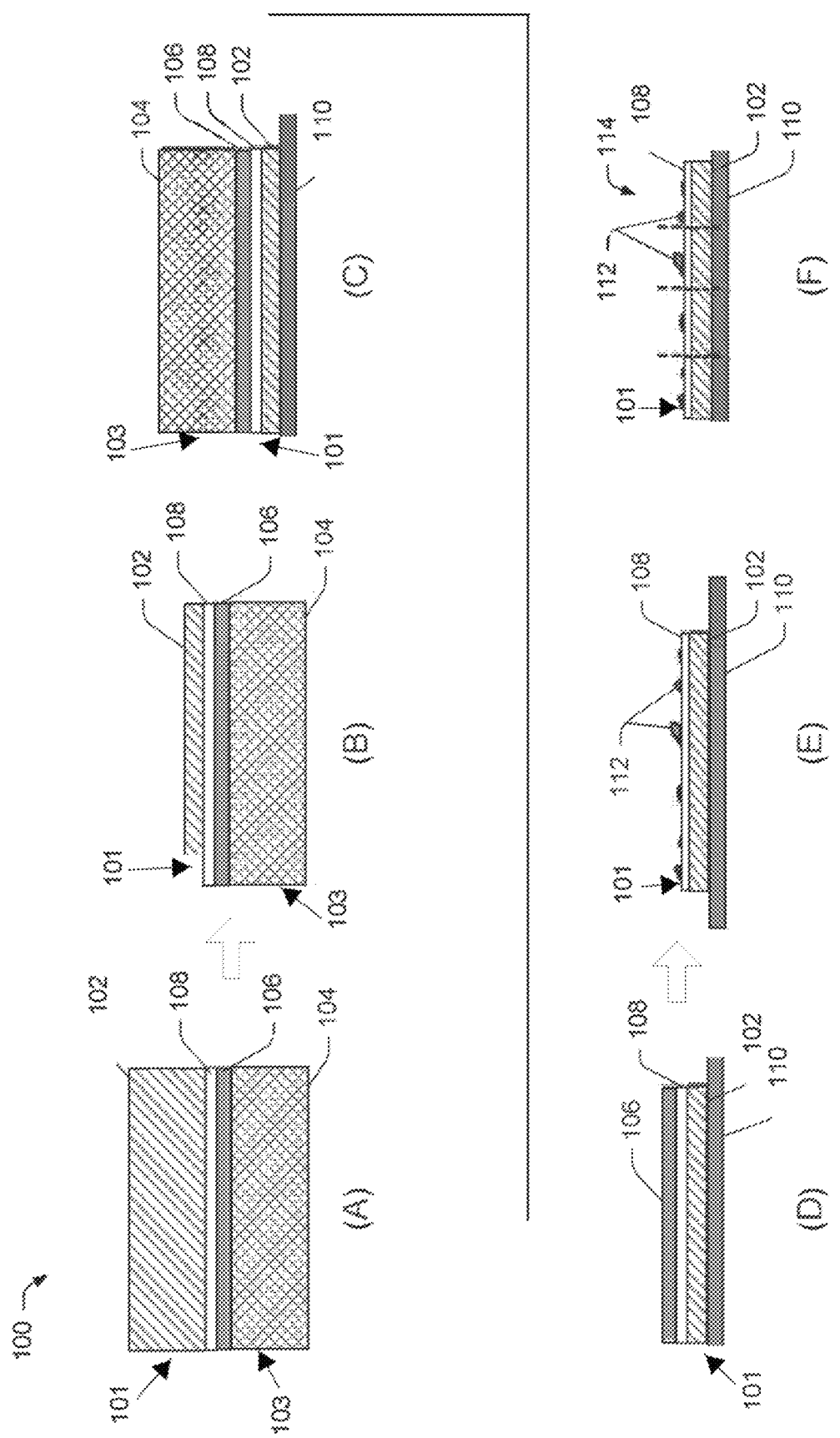
FIG. 1 is a schematically illustrated flow diagram illustrating an example die processing sequence.

Representative implementations provide techniques for processing integrated circuit (IC) dies and related devices, in preparation for stacking and bonding the devices. Processed devices can be left with surface residue, negatively affecting bonding. The disclosed techniques improve residue removal from the device surfaces while protecting the underlying layers. One or more sacrificial layers may be applied to a surface of the device during processing to protect the underlying layers. Processing residue attached to the sacrificial layer(s) instead of the device can be removed with the sacrificial layer(s).

In various implementations, example processes include wet etching the surface of the device to remove the sacrificial layers and residue. In some embodiments, one or more of multiple sacrificial layers are removed at different processing stages to protect underlying layers during the processing stages. In some examples, a selective etchant (a wet etchant) may be used to remove one or more sacrificial layers and residue without damaging the surface of the device or damaging metallic interconnect structures on the surface of the device.

Various implementations and arrangements are discussed with reference to electrical and electronics components and varied carriers. While specific components (i.e., wafers, integrated circuit (IC) chip dies, etc.) are mentioned, this is not intended to be limiting, and is for ease of discussion and illustrative convenience. The techniques and devices discussed with reference to a wafer, die, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic element." For simplicity, such components will also be referred to herein as a "die" or a "substrate."

The disclosed processes are illustrated using graphical flow diagrams. The order in which the disclosed processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Implementations are explained in more detail below using a plurality of examples. Although various implementations and examples are discussed here and below, further implementations and examples may be possible by combining the features and elements of individual implementations and examples.

DETAILED DESCRIPTION

Overview

Various embodiments of techniques for processing integrated circuit (IC) dies and related devices, in preparation for stacking and bonding the devices, are disclosed. Devices undergoing processing can be left with surface residue from the process steps, negatively affecting bonding. The disclosed techniques improve residue removal from the device surfaces while protecting the underlying layers.

In various embodiments, using the techniques disclosed can simplify the stacking process for minimal tolerance stacking and bonding techniques, reduce die fabricating and processing costs and improve profit margins, reduce defects in temporary bonding operations, allow for higher stacked device yield, eliminate key process defects, and can reduce handling of dies to minimize particle generation. Dies to be stacked and bonded using surface to surface direct bonding techniques without adhesive, such as "ZIBOND®," and/or hybrid bonding, such as "Direct Bond Interconnect (DBI®)" both available from Ziptronix, Inc., a Xperi Technologies company (see for example, U.S. Pat. Nos. 6,864,585 and 7,485,968, which are incorporated herein in their entirety), which can be susceptible to particles and contaminants due to the need for an extremely flat interface, can particularly benefit. The removal of particles between opposing insulator, semiconductor, and/or conductor layers improves the flatness of the surfaces and, accordingly, the ability of the two surfaces to bond.

For example, a graphically illustrated flow diagram is shown at FIG. 1, illustrating an example die processing sequence 100. At block (A) the process begins with preparing a substrate assembly by bonding a substrate handle 104 of a second microelectronic element 103 to a substrate 102 (including one or more devices (devices not shown)) of a first microelectronic element 101 using a temporary bonding layer 106. Wiring layers 108 of the substrate 102 are comprised of a metal (such as copper, etc.), and are contacted by the bonding layer 106. In various examples, the bonding layer 106 is comprised of a high temperature polymer, an epoxy, polyimide, an acrylic, or the like, to ensure the handle 104 remains bonded to the device 102 during processing.

At block (B), a portion of the back side of the substrate 102 is removed to the desired dimensions, using one or more techniques (e.g., grinding, chemical mechanical polishing/planarizing (CMP), reactive-ion etching (RIE), etc.). The backside of the thinned substrate 102 may be processed further, for example, to form an interconnect routing layer, a passive component layer, or other structures or features of interest. At block (C), the substrate 102 with one or more devices is attached to a dicing sheet 110 for singulation. The handle substrate 104 is now on the "topside," in preparation for its removal.

At block (D), the handle 104 may be removed, by grinding, etching, polishing, sliding off, or by optical degrading of the temporary bonding adhesive layer 106, etc.). At block (E), the temporary bond layer 106 is removed. As shown at block (E), the removal process typically leaves some residue 112 behind. The residue 112 can have varying thicknesses (e.g., thickness may range from 5 nm to 30 um, or even higher). Plasma ashing can be used to remove thin residue 112, but even long oxygen plasma ashing steps (e.g., over 40 minutes) may not remove the thickest residues 112, and in many instances, may oxidize the wiring layer 108, for example, a copper interconnect layer 108. Longer ashing times also may roughen the surface of the exposed wiring layer 108, which can reduce the yield of the bonded devices. In some cases, a high temperature (e.g., over 50° C.) wet etch process is used to remove thick residue 112; however, the process may not be compatible with other die layers or materials. For instance, the high temperature wet process can dissolve portions of the surface the conductive metals of the wiring layer(s) 108, thus degrading the metal wiring layer(s) 108, removing more metal than is desirable and leaving a rough surface topography. In some low-tolerance bonding methods, such as "ZIBOND®" and "Direct Bond Interconnect (DBI®)", it is desirable for the metal topography (e.g., of the wiring layer(s) 108) to have less than 10 nm variance for successful bonds.

At block (F), the substrate 102 is singulated into dies 114. As shown, the residue 112 may remain on the dies 114, potentially resulting in poor bonding, and reduced product yield.

Example Implementations

In various implementations, one or more protective layers can be applied to sensitive device layers prior to bonding carriers or handle substrates to the sensitive layers. Removal of the protective (sacrificial) layer(s) also removes any residue left when removing the bonding layer. In various embodiments, the protective layer may be removed using a room-temperature or near room-temperature process that does not damage the underlying sensitive insulating and conductive layers.

Figure 2:
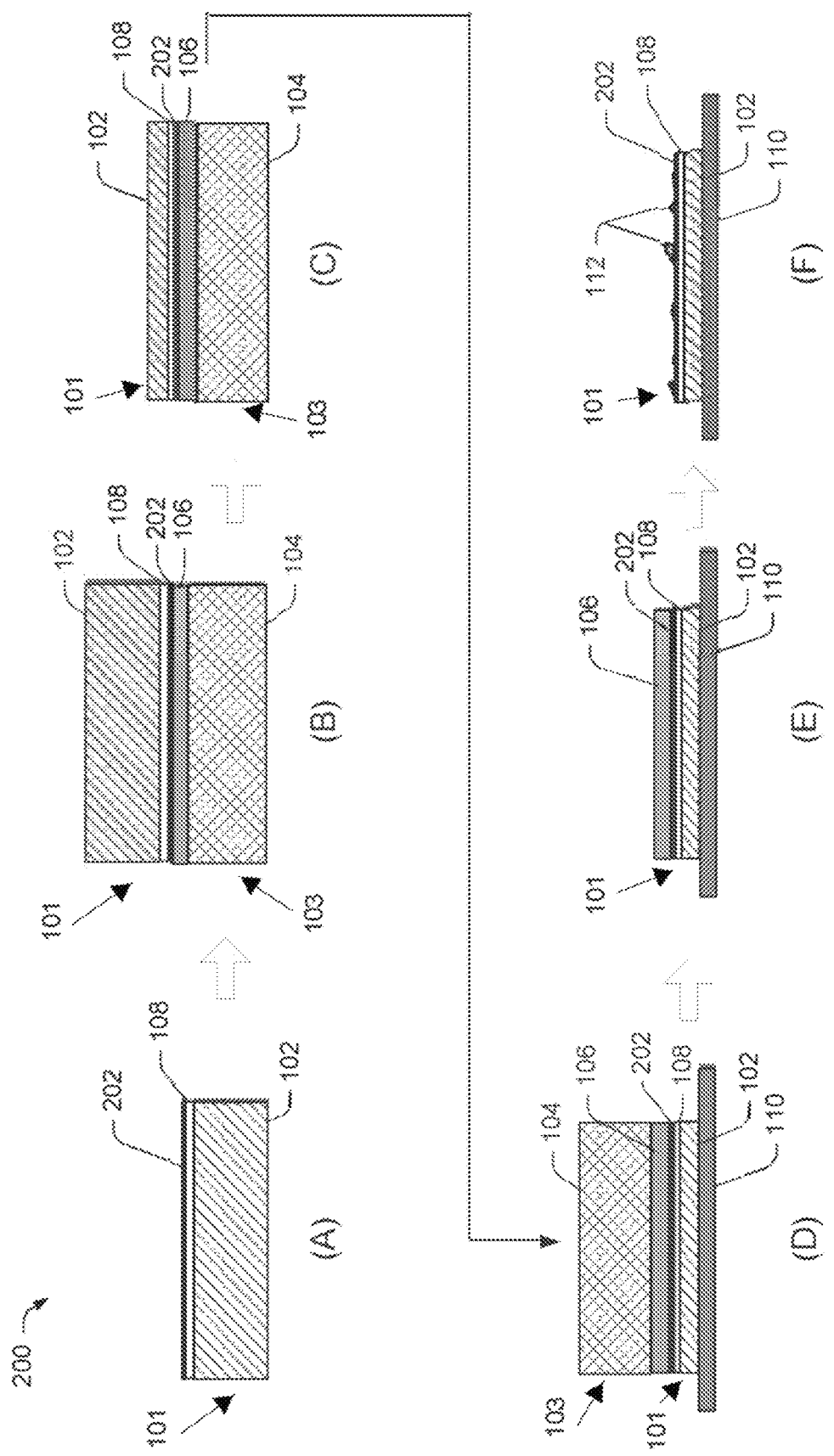
FIGS. 2 and 3 show a schematically illustrated flow diagram illustrating an example die processing sequence, according to a first embodiment.
Figure 3:
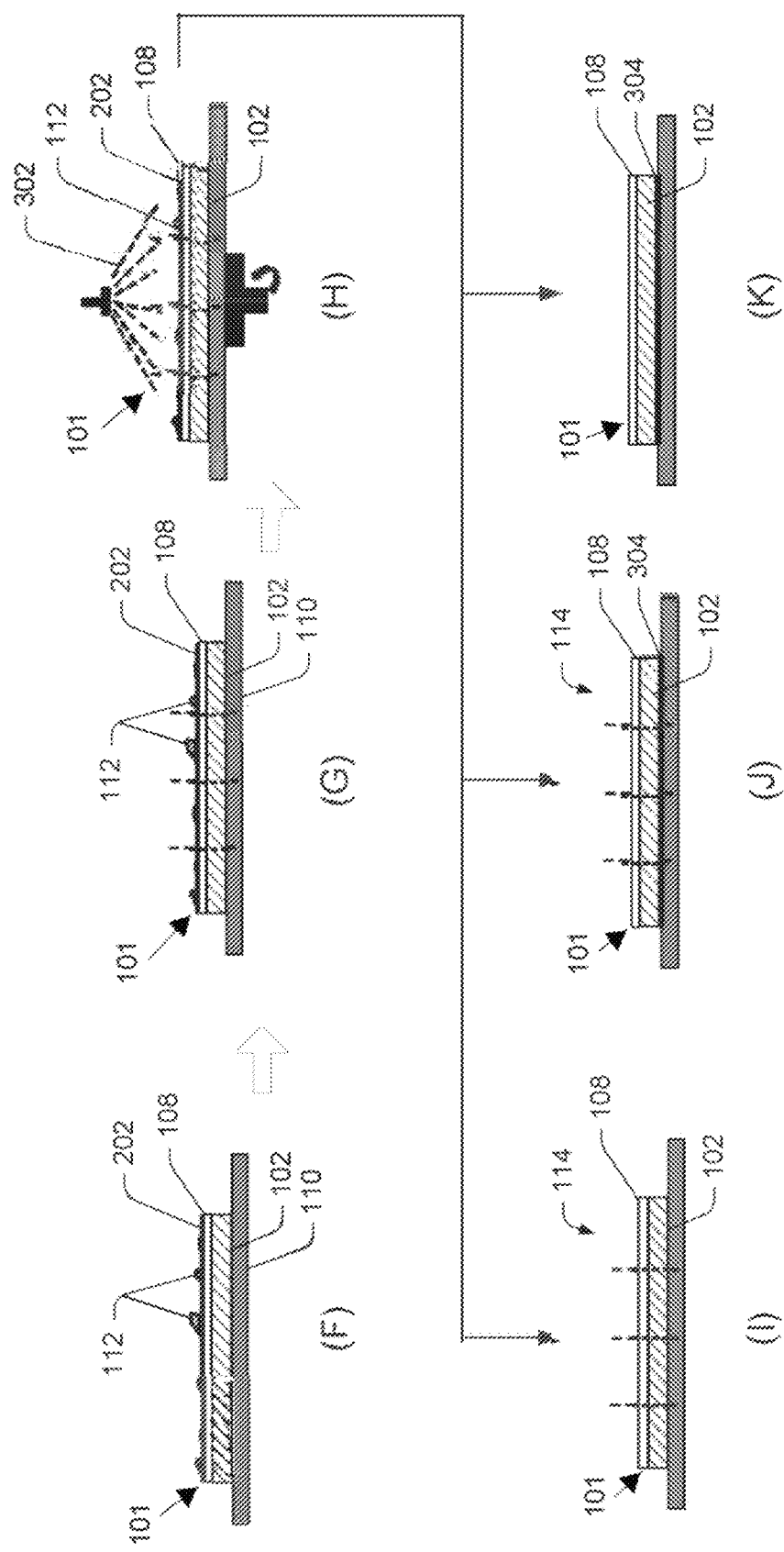

For example, FIGS. 2 and 3 show a graphically illustrated flow diagram illustrating an example die processing sequence 200, according to a first embodiment. As shown in FIG. 2 at block (A), prior to applying the temporary adhesive 106 and handle substrate 104, a thin inorganic protective layer 202 is formed (spun on, for example) over the wiring layer 108 of the substrate 102 of the first microelectronic element 101. In various embodiments, the protective layer 202 may comprise one or more of SiO2 (silicon dioxide), B—SiO2 (i.e. boron doped silicon dioxide), P—SiO2 (i.e. phosphorus doped silicon dioxide), or the like. In other embodiments, the protective layer 202 may comprise a non-stoichiometric dielectric material (non-device quality dielectric material) coated by a lower temperature plasma enhanced chemical vapor deposition (PECVD), an atomic layer deposition (ALD), a plasma enhanced atomic layer deposition (PEALD), or like methods. The protective layer 202 may be less than 50nm thick in some embodiments (thicker or thinner in other embodiments). As part of the process, depending on the nature of the coating process, the protective layer 202 may be cured at a temperature less than 100° C. in inert gas or vacuum for approximately 30 minutes. In various other implementations, the curing temperature and time and ambient environment may vary. In some cases, the protective layer 202 may be subsequently treated with plasma radiation prior to adding the adhesive layer 106.

At block (B) the substrate 102 including one or more devices (devices not shown) is bonded to a handle substrate 104 of the second microelectronic element 103_using a temporary adhesive 106, as described above. In the example process 200, the bond layer 106 contacts the protective (sacrificial) layer 202 instead of contacting the metal wiring layer 108. In this way, the sensitive metallic wiring layer 108 is protected from the adhesive 106 and its residue 112. At block (C), the substrate 102 is reduced as desired for the intended application and processed further as needed. At block (D), the reduced substrate 102 is attached to a dicing sheet 110, with the handle 104 topside.

At block (E), the handle 104 is removed, and at block (F), the temporary bond layer 106 is removed, leaving residue 112 behind. In this example process 200, the residue 112 is left on the protective layer 202 rather than the metal wiring layer 108. In some other embodiments, the undesirable residue 112 may be residue from the dicing sheet or grinding sheet adhesive. Regardless of the source of the undesirable residue 112, the devices utilizing the substrate 102 are formed in such a sequence that the undesirable residue 112 is in contact with the protective sacrificial layer 202.

Referring to FIG. 3, the process 200 is continued. Block (F) is illustrated again in FIG. 3 for continuity and ease of discussion. As an optional process step, at block (F) the residue 112 may be exposed to oxygen plasma, for less than 10 minutes for example, to remove the thinner residue 112. In an embodiment, the plasma exposure can also increase the hydrophilicity and weaken the bonds in the coated inorganic protective layer 202, and make the protective layer 202 and the residue 112 easier to clean off the substrate 102. At block (G), the substrate 102 is singulated into dies 114. As shown at block (G), residue 112 may remain (or further accumulate) on the dies 114, on the protective layer 202, after singulation.

At block (H), a wet dilute etchant 302 (e.g., buffered oxide etchant (BHF), hydrofluoric acid (HF), glycated dilute BFH or HF, or the like), for instance, with fluoride ions concentration less than 2% and preferably less than 0.2%, is sprayed onto the dies 114 to break up and remove the inorganic protective layer 202. In some embodiments, it is preferable that the etchant 302 includes a complexing agent to suppress the etching of the metal in the wiring layer 108 beneath the protective layer 202. The complexing agent may comprise, for example where the conductive metal is copper, a complexing agent with a triazole moiety, or the like. The wet etchant 302 may be applied by spin process (as illustrated), another batch process, or the like, for a preselected duration of time, as desired. The complexing agent may be removed in a subsequent cleaning operation with a suitable solvent, for example, a solvent containing an alcohol.

At block (I), the singulated dies 114 are shown free from residue 112. The removal of the protective layer 202 also removes the residue 112 from the surface of the dies 114, without degrading the wiring layer 108 of the dies 114. In an embodiment, as shown at blocks (J) and (K), one or more additional inorganic (or organic, in alternative embodiments) protective layers 304 are shown as having been previously added to the second (opposite) surface of the substrate 102. For instance, in various implementations, the additional protective layer(s) 304 can be optionally added to the second surface of the substrate 102 to protect the substrate 102 during various processes. The protective layer(s) 304 may be added prior to locating the substrate 102 onto the dicing sheet, for instance (see block (D)). In such an embodiment, the protective layer(s) 304 may protect the second surface of the substrate 102 from residue or adhesive associated with the dicing sheet, or may facilitate cleaning such residue from the second surface of the substrate 102. At block (J) the substrate 102 is shown singulated into dies 114 and at block (K) the substrate 102 is shown intact.

Figure 4:
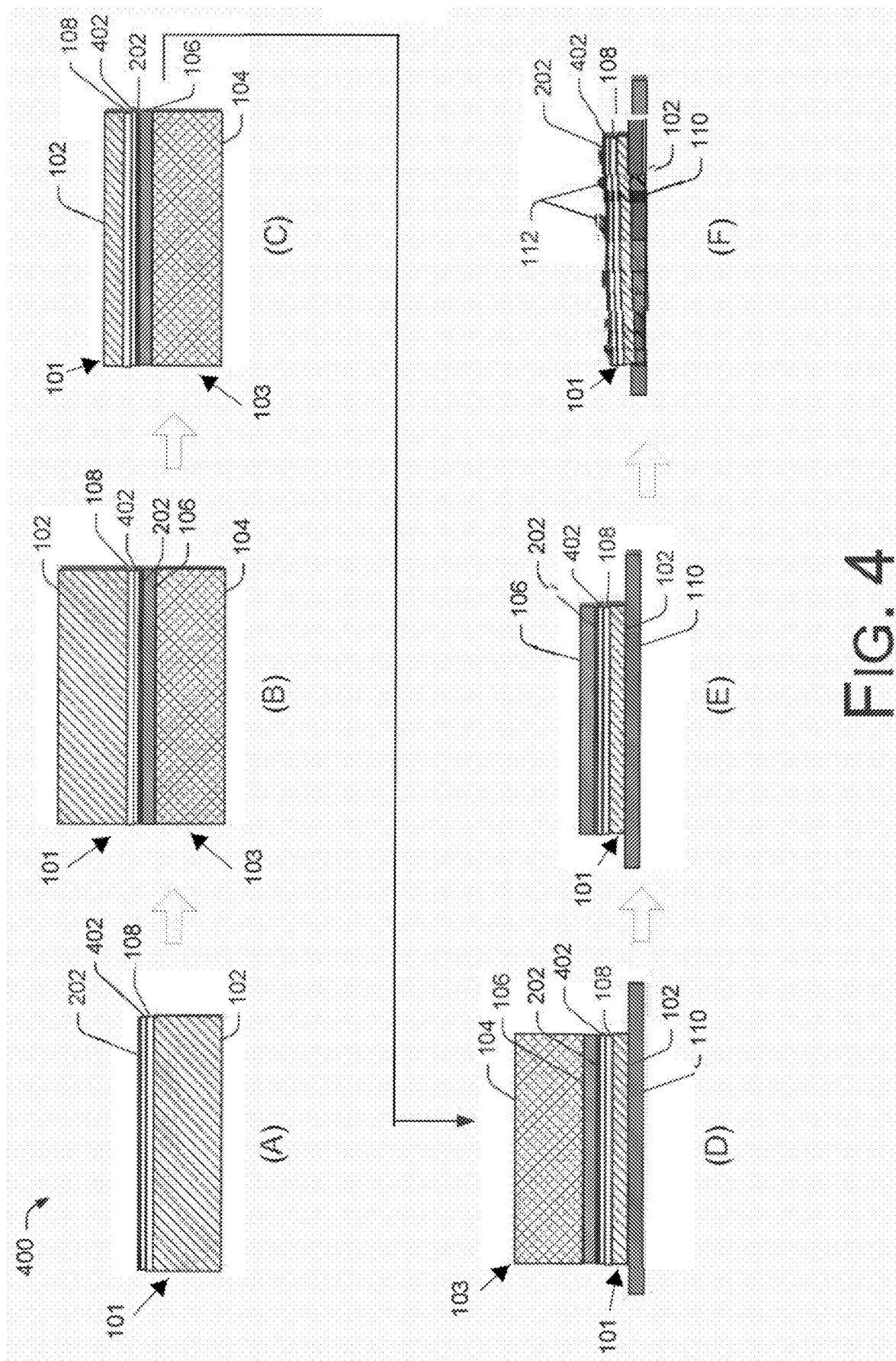
FIGS. 4 and 5 show a schematically illustrated flow diagram illustrating an example die processing sequence, according to a second embodiment.
Figure 5:
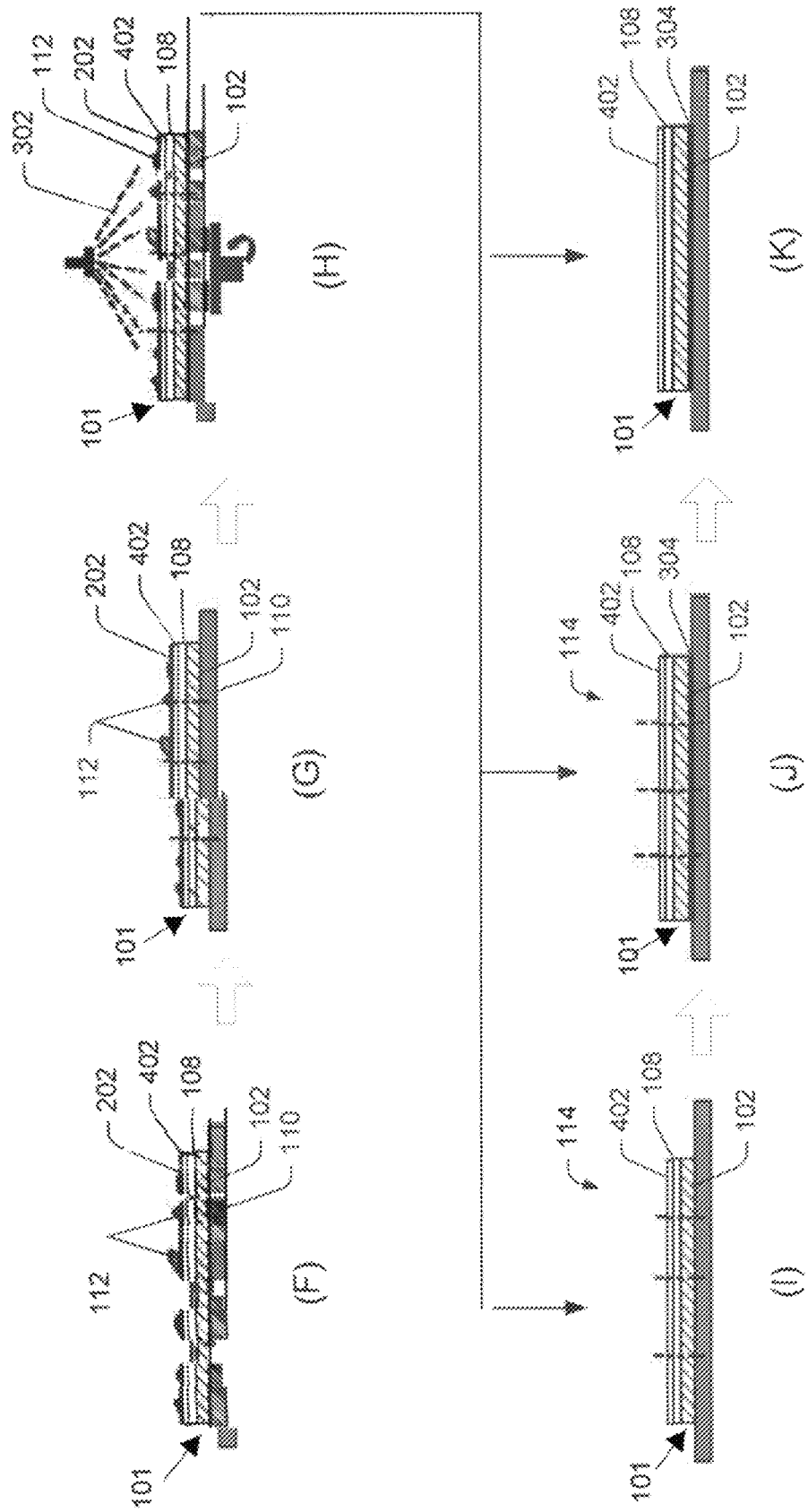

Another example die processing sequence 400 is shown at FIGS. 4 and 5, according to various embodiments. In the embodiments, two or more protective layers 202 and 402 are applied to the metal wiring layer 108 prior to the adhesive 106. In an embodiment, the wiring layer 108 is protected with an organic protective layer 402 (such as an organic resist, or the like), and the organic protective layer 402 is protected by the inorganic protective (sacrificial) layer 202, as discussed above, prior to bonding the handle substrate 104 to the substrate 102. In the embodiments, the use of additional protective layers (such as the protective layer 402) allows underlying layers (such as the wiring layer 108) to be protected while exposed layers are processed. For instance, the additional organic protective layer 402 allows the protective layer 202 to be removed using chemicals and/or techniques that may be harmful (e.g., corrosive, roughening, depletive) to the wiring layer 108.

Referring to FIG. 4, at block (A), the substrate 102 of the first microelectronic element 101 including one or more devices (devices not shown) is initially coated with a thin (spun on, for example) organic protective layer 402 over the wiring layer 108, followed by the thinner inorganic protective layer 202 (e.g., SiO2, B—SiO2, P—SiO2, and the like), as described above.

At block (B) the substrate 102 is bonded to a handle substrate 104 of the second microelectronic element 103 using a temporary bond 106, as described above. Also in this example, the bond layer 106 contacts the protective (sacrificial) layer 202 instead of contacting the metal wiring layer 108 or the organic layer 402. At block (C), the substrate 102 is reduced as desired, and at block (D), the reduced substrate 102 is attached to a dicing sheet 110, with the handle 104 topside.

At block (E), the handle 104 is removed, and at block (F), the temporary bond layer 106 is removed, generally leaving residue 112 behind. Also in this example, the residue 112 is left on the protective layer 202 rather than the metal wiring layer 108 or the organic layer 402.

Referring to FIG. 5, the process 400 is continued. Block (F) is reproduced at FIG. 5 for continuity and ease of discussion. Optionally, at block (F) the residue 112 may be exposed to oxygen plasma, for less than 10 minutes for example, to remove the thinner residue 112 layer and also to increase the hydrophilicity and weaken the bonds in the coated inorganic protective layer 202. This can make the protective layer 202 and the residue 112 easier to clean off the substrate 102. At block (G), the substrate 102 is optionally singulated into dies 114. As shown, the residue 112 may remain on the dies 114, on the protective layer 202. At block (H), a wet dilute etchant 302 (e.g., buffered oxide etchant (BHF), hydrofluoric acid (HF), or the like), is sprayed onto the dies 114 to break up and remove the inorganic protective layer 202. The wet etchant 302 may be applied by spin process, or the like, for a preselected duration of time as desired. The protective organic layer 402 remains on the dies 114.

At block (I), the singulated dies 114 are shown substantially free from residue 112. The removal of the protective layer 202 also removes the residue 112 from the surface of the dies 114, without degrading the wiring layer 108, at least in part due to the protective organic layer 402 over the wiring layer 108. In an embodiment, as shown at blocks (J) and (K), one or more additional inorganic or organic protective layer 304 are shown as having been previously added to the second (opposite) surface of the substrate 102. For instance, in various implementations, the additional protective layer(s) 304 can be optionally added to the second surface of the substrate 102 to protect the substrate 102 during various processes. The protective layer(s) 304 may be added prior to locating the substrate 102 onto the dicing sheet, for instance (see block (D)). In such an embodiment, the protective layer(s) 304 may protect the second surface of the substrate 102 from residue or adhesive associated with the dicing sheet, or may facilitate cleaning such residue from the second surface of the substrate 102. At block (J) the substrate 102 is shown singulated into dies 114 and at block (K) the substrate 102 is shown intact.

In one embodiment, after the removal of the temporary bonding layer 106 as depicted in FIG. 1 at block (E), FIG. 3 at block (F) and FIG. 5 at block (F) for example, the undesirable residue 112 may be removed by removing the layer 202 prior to the singulation step. In other words, the substrate 102 may be singulated with or without the protective layer 202. For example, the substrate 102 may be coated with a protective layer (such as the layer 202, for example) before the singulation step to prevent dicing debris from mechanical dicing (e.g., sawing) from adhering to the wiring layer 108 during singulation, and to allow the dicing debris to be removed along with the protective layer 202.

In various embodiments, other protective layer combinations (and any number of protective layers) may be used to protect underlying layers from the effects of process steps. Each protective layer may be chemically engineered to be selectively removed, while a layer below the protective layer being removed protects underlying layers, such as the wiring layer 108, for instance. An organic layer may be hydrophobic or hydrophilic to act as an affinity for a solvent used. For example, a two-layer combination may include two photoresist layers, one hydrophobic layer and one inorganic layer, or the like. A combination of three or more protective layers may also be used in a similar way, as each layer acts to protect a lower layer from negative effects of processing. In general, ensuring that the wiring layer 108 is not degraded by metal removal or roughing of the topography is the goal of the one or more protective layers. In various embodiments, after the wet cleaning steps, the processed substrates or dies may be further processed prior to bonding to another clean dielectric surface.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

The invention claimed is:

1. A method of forming a microelectronic assembly, comprising:
   providing a first microelectronic element having a first substrate and a wiring layer at or below a top surface of the first substrate;
   coating a top surface of the wiring layer with a first protective layer and a second protective layer;

bonding a second microelectronic element having a second substrate to the second protective layer via an adhesive material;

processing the first microelectronic element;

removing the second microelectronic element;

removing the adhesive material from the second protective layer;

exposing the first microelectronic element, the first and second protective layers, and a residue of the adhesive material to a wet chemical, the wet chemical removing the second protective layer without removing the first protective layer, wherein the wet chemical modifies a characteristic of the first protective layer; and removing the first protective layer from the top surface of the first substrate.

2. The method of claim 1, further comprising hybrid bonding the top surface of the first microelectronic element to another microelectronic element.

3. The method of claim 1, wherein the wet chemical modifies a moisture absorption characteristic of the first protective layer.

4. The method of claim 1, wherein the wet chemical comprises a buffered oxide etchant or hydrofluoric acid.

5. The method of claim 1, wherein the wet chemical comprises a complexing agent adapted to suppress dissolution of the wiring layer.

6. A method of forming a microelectronic assembly, comprising:

providing a first microelectronic element having a wiring layer at or below a top surface of the first microelectronic element;

coating the top surface of the wiring layer with one or more protective layers;

bonding a second microelectronic element to the one or more protective layers via an adhesive material;

processing the first microelectronic element;

removing the second microelectronic element;

removing the adhesive material from the one or more protective layers;

exposing the first microelectronic element, the one or more protective layers, and a residue of the adhesive material to a wet chemical, the wet chemical decomposing at least one protective layer, wherein the wet chemical does not dissolve, roughen, or degrade the wiring layer; and removing the one or more protective layers and the residue of the adhesive material from the top surface of the wiring layer.

7. The method of claim 6, further comprising hybrid bonding the top surface of the first substrate to another microelectronic element.

8. The method of claim 6, wherein the wet chemical comprises a buffered oxide etchant or hydrofluoric acid.

9. The method of claim 1, wherein processing the first microelectronic element comprises removing a portion of a back side of the first substrate.

10. The method of claim 1, wherein processing the first microelectronic element comprises reducing a thickness of the first substrate.

11. A method of forming a microelectronic assembly, comprising:

providing a substrate including a wiring layer at a bonding surface of the substrate;

coating the wiring layer with one or more protective layers;

exposing the substrate and the one or more protective layers to a wet chemical, wherein the wet chemical comprises a complexing agent adapted to suppress dissolution of the wiring layer while also decomposing the one or more protective layers; and hybrid bonding the bonding surface of the substrate to another bonding surface of another microelectronic element.

12. The method of claim 11, further comprising washing the one or more protective layers after exposing the substate and the one or more protective layers to the wet chemical.

13. The method of claim 11, further comprising singulating the substrate into a plurality of dies.

14. The method of claim 13, wherein singulating the substrate comprises singulating the substrate before exposing the substrate and the one or more protective layers to the wet chemical.

15. The method of claim 14, further comprising coating the wiring layer before singulating.

16. The method of claim 13, wherein singulating the substrate comprises singulating the substrate after exposing the substrate and the one or more protective layers to the wet chemical.

17. The method of claim 13, wherein hybrid bonding the bonding surface of the substrate comprises hybrid bonding the bonding surface of at least one die of the plurality of dies to the other bonding surface of the other microelectronic element.

18. The method of claim 11, further comprising, before exposing the substrate and the one or more protective layers to the wet chemical, bonding a second microelectronic element having a second substrate to the one or more protective layers via an adhesive material, processing the substrate, and removing the second microelectronic element.

19. The method of claim 18, further comprising removing the adhesive material before exposing the substrate and the one or more protective layers to the wet chemical, the wet chemical removing a residue of the adhesive.

20. The method of claim 11, wherein the wet chemical comprises a buffered oxide etchant or hydrofluoric acid.

21. The method of claim 11, wherein the one or more protective layers comprises an organic material.

\* \* \* \* \*